(12) United States Patent
Sjöström

(10) Patent No.: US 8,335,250 B2
(45) Date of Patent: Dec. 18, 2012

(54) MULTI-LEVEL PULSE WIDTH MODULATION POWER AMPLIFIER METHOD AND APPARATUS

(75) Inventor: Johan Sjöström, Tyresö (SE)

(73) Assignee: Infineon Technologies AG, Neubiberg (DE)

( * ) Notice: Subject to any disclaimer, the term of this patent is extended or adjusted under 35 U.S.C. 154(b) by 1093 days.

(21) Appl. No.: 12/202,768

(22) Filed: Sep. 2, 2008

(65) Prior Publication Data

US 2010/0054325 A1   Mar. 4, 2010

(51) Int. Cl.
*H03K 9/08* (2006.01)
(52) U.S. Cl. ........................................... 375/238
(58) Field of Classification Search .................. 375/238
See application file for complete search history.

(56) References Cited

U.S. PATENT DOCUMENTS

| | | | |
|---|---|---|---|
| 2002/0197957 A1* | 12/2002 | Kawasaki et al. | 455/42 |
| 2009/0028251 A1* | 1/2009 | Letemplier | 375/259 |
| 2009/0034603 A1* | 2/2009 | Lakdawala et al. | 375/238 |
| 2009/0270056 A1* | 10/2009 | Singerl et al. | 455/127.1 |

OTHER PUBLICATIONS

Raab, F. H. "Efficiency of Doherty RF Power-Amplifier Systems." IEEE Transactions on Broadcasting, vol. BC-33, No. 3, Sep. 1987, pp. 77-83.
Choi, J. et al. "A ΔΣ-Digitized RF Transmitter." IEEE/MTT-S International Microwave Symposium, Jun. 3-8, 2007, pp. 81-84.
Yang, Y. et al. "A Fully Matched N-Way Doherty Amplifier with Optimized Linearity." IEEE Transactions on Microwave Theory and Techniques, vol. 51, No. 3, Mar. 2003, pp. 986-993.
Srirattana, N. et al. "Analysis and Design of a High-Efficiency Multistage Doherty Power Amplifier for Wireless Communications." IEEE Transactions on Microwave Theory and Techniques, vol. 53, No. 3, Mar. 2005, pp. 852-860.
Wang, Y. "A Class-S RF Amplifier Architecture with Envelope Delta-Sigma Modulation." IEEE Radio and Wireless Conference (RAWCON 2002), Aug. 11-14, 2002, pp. 177-179.
Jeon, Y.-S. et al. "A Novel High-Efficiency Linear Transmitter Using Injection-Locked Pulsed Oscillator." IEEE Microwave and Wireless Components Letters, vol. 15, No. 4, Apr. 2005, pp. 214-216.
Dupuy, A. et al. "Digital Pulse Width Modulated (PWM) Microwave Signal using a High Efficiency Class-E Amplifier." 2003, Internet article available at: http://www.mwlab.ee.ucla.edu/publications/2003c/DUPUY__apmc__2003.pdf.
Viswanathan, V. "Efficiency Enhancement of Base Station Power Amplifiers using Doherty Technique." Thesis submitted to the faculty of the Virginia Polytechnic Institute and State University in partial fulfillment of the requirements for the degree of Master of Science in Electrical Engineering, Feb. 3, 2004.

* cited by examiner

*Primary Examiner* — Shuwang Liu
*Assistant Examiner* — Michael Neff
(74) *Attorney, Agent, or Firm* — Murphy, Bilak & Homiller, PLLC

(57) ABSTRACT

A baseband signal is processed by amplifying a first pulse width modulation radio frequency signal having a first non-negligible peak-to-peak amplitude and a second non-negligible peak-to-peak amplitude larger than the first non-negligible peak-to-peak amplitude. A second pulse width modulation radio frequency signal is also amplified, the second pulse width modulation radio frequency signal having a third non-negligible peak-to-peak amplitude approximately equal to the second non-negligible peak-to-peak amplitude of the first pulse width modulation signal when the baseband signal power is at or above the second threshold level. The amplified signals are constructively combined to form a pulse width modulation radio frequency signal comprising a plurality of non-negligible peak-to-peak amplitude levels each corresponding to a different baseband signal power range.

18 Claims, 8 Drawing Sheets

MULTI-LEVEL PULSE WIDTH MODULATION POWER AMPLIFIER METHOD AND APPARATUS

BACKGROUND OF THE INVENTION

The present invention generally relates to signal modulation, and particularly relates to imparting signal modulations by driving multiple Radio Frequency (RF) power amplifiers with single or multi-level Pulse Width Modulation (PWM) input signals, and combining their output signals efficiently to construct a multi-level PWM RF signal.

In many fields, for example in third and higher generation base stations, bandwidth-optimized modulation schemes are used for transmitting information. Bandwidth-optimized modulation schemes require a non-constant envelope, and thus have a relatively high peak-to-average power ratio (PAR). Linear power amplifiers such as class AB amplifiers are typically used because they offer high linearity. However, class AB amplifiers must be driven with a high back-off from the maximum (saturated) output power to achieve good linearity across a wide operating range. RF power amplifiers, of what ever class, e.g. type AB, or so-called switched-mode amplifiers of type D, E, F, etc., only achieve high efficiency when operated close to their maximum saturated power level. Thus, backing-off a class AB amplifier results in lower transmitted power, and thus reduced overall power efficiency.

Other conventional signal modulation techniques exist for Radio Frequency (RF) applications. However, each of the techniques suffers from poor power efficiency, poor linearity, complexity or other limitations, especially when the signal bandwidth is large. For example, supply voltage regulation techniques have poor power efficiency if the voltage regulator must have a large bandwidth. Linearity is problematic for Doherty amplifiers. Out-phasing, where two equally sized power amplifier outputs with an appropriately designed phase relation are combined via a power combiner, suffers from constant power dissipation. Delta sigma modulators used in conjunction with a high-power output stage tend to be less efficient than their PWM counterparts.

A pulse width modulator has been used to drive an RF power amplifier to impart amplitude signal modulations based on the duty cycle of the PWM signal applied to the RF amplifier. A conventional class AB or switched-mode RF power amplifier is driven into saturation by an input RF PWM signal, consisting of on-off bursts of an RF carrier with constant amplitude. The average burst duration (duty cycle) is made proportional to the baseband signal amplitude by so-called PWM coding. A way of generating a PWM signal is to compare, with a comparator circuit, the baseband signal to a threshold signal in the form of a triangle waveform with frequency $f_s$, typically on the order of 10 times higher than the bandwidth B of the baseband signal. The comparator output signal is a baseband PWM signal, which is multiplied with an RF carrier, to form the RF PWM signal. In the case the RF carrier is phase modulation, the baseband signal fed to the comparator is typically the envelope of a complex baseband signal. When the baseband signal is below the threshold signal, there is ideally no input signal to, or output signal from, the RF power amplifier. The amplified RF PWM signal is then passed through a band-pass filter with bandwidth $B_f$, where typically $B < B_f < f_s$, to remove the out-of-band power associated with the PWM, retaining only the desired amplified modulation RF signal. The efficiency of the RF power amplifier is ideally independent of the burst duration, apart from losses related to turning the amplifier on and off, which relatively become more significant the shorter the burst.

However, at lower baseband power levels, the PWM burst duration decreases, increasing the fraction of out-of-band versus in-band spectral power in the RF PWM signal. If the band-pass filter is connected directly to the amplifier output, it will typically present impedance terminations for the out-of-band spectral components which will prevent the amplifier from operating efficiently, if special care is not taken in the design of the amplifier, possibly leading to a more complex implementation. A circulator can be inserted between the amplifier output and the band-pass filter input, causing the out-of-band power to be reflected to the circulator dump port and dissipated into a matched load, without upsetting the amplifier. This has the drawback of reduced overall transmitter efficiency for low baseband signal levels (corresponding to short bursts), where the out-of-band power is high, although the RF amplifier itself is still operating efficiently.

SUMMARY OF THE INVENTION

According to the methods and apparatus taught herein, a baseband signal is processed by amplifying a first pulse width modulation radio frequency signal having a first non-negligible peak-to-peak amplitude and a second non-negligible peak-to-peak amplitude larger than the first non-negligible peak-to-peak amplitude. A second pulse width modulation radio frequency signal is also amplified, the second pulse width modulation radio frequency signal having a third non-negligible peak-to-peak amplitude approximately equal to the second non-negligible peak-to-peak amplitude of the first pulse width modulation signal when the baseband signal power is at or above the second threshold level. The amplified signals are constructively combined to form a pulse width modulation radio frequency signal comprising a plurality of non-negligible peak-to-peak amplitude levels each corresponding to a different baseband signal power range.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
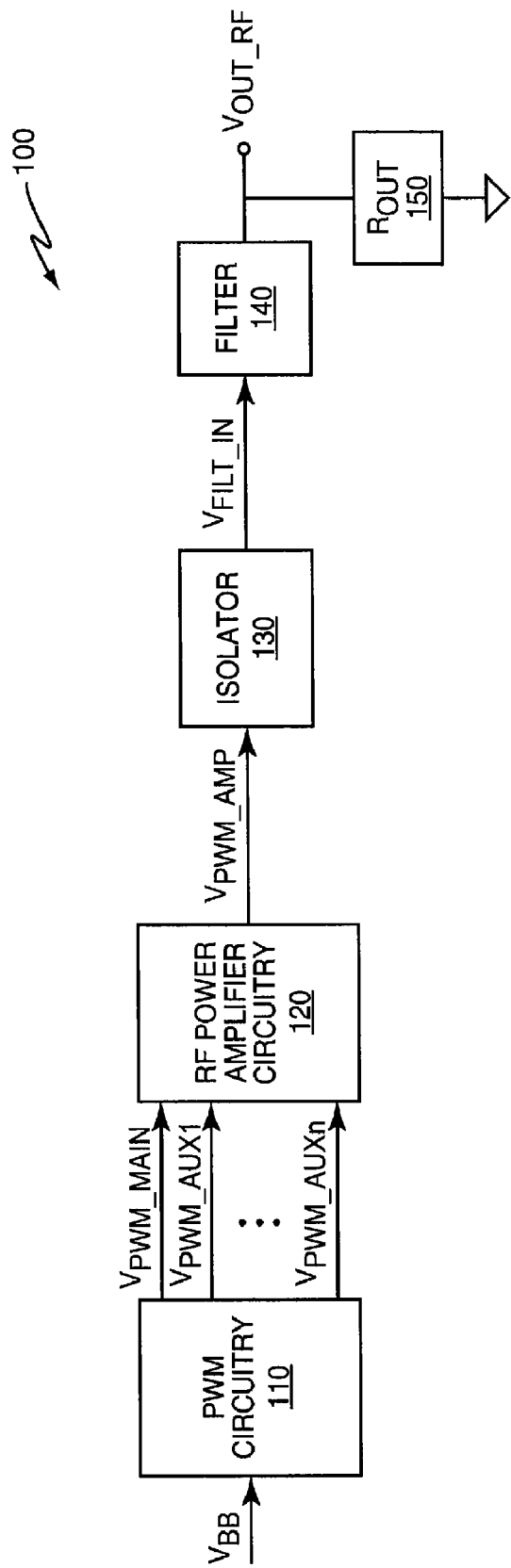
FIG. 1 is a block diagram of an embodiment of an RF transmitter including PWM and RF power amplifier circuitry.

FIG. 1 illustrates an embodiment of an RF transmitter 100 that converts a baseband signal ($V_{BB}$) to a radio frequency output signal ($V_{OUT\_RF}$). Amplitude modulations are imparted by PWM and RF power amplifier circuitry 110, 120 included in or associated with the RF transmitter 100. The PWM circuitry 110 generates a main PWM input signal ($V_{PWM\_MAIN}$) and at least one auxiliary PWM input signal ($V_{PWM\_aux1}$ to $V_{PWM\_auxn}$) based on the power level of the baseband signal as will be described in more detail later. The PWM input signals are provided to the RF power amplifier circuitry 120 for amplification. The amplifier circuitry 120 includes a main power amplifier and at least one auxiliary power amplifier. The transmitter power level is controlled by varying the amplitude and burst duration (i.e., duty cycle) of the PWM input signals applied to the amplifiers as a function of baseband signal power. The one or more auxiliary amplifiers are sequentially driven by the respective auxiliary PWM input signal when the input baseband signal magnitude reaches certain time-varying thresholds, providing additional power as needed, e.g., as illustrated by Step 200 of FIG. 2. This way, the transmitter 100 is more efficient across a wider range of output power levels, compared to a transmitter using a single amplifier, because there is less out-of-band power in the multi-level RF PWM signal $V_{PWM\_AMP}$, to be reflected by filter 140 and dissipated at the dump port of isolator 130.

Figure 2:
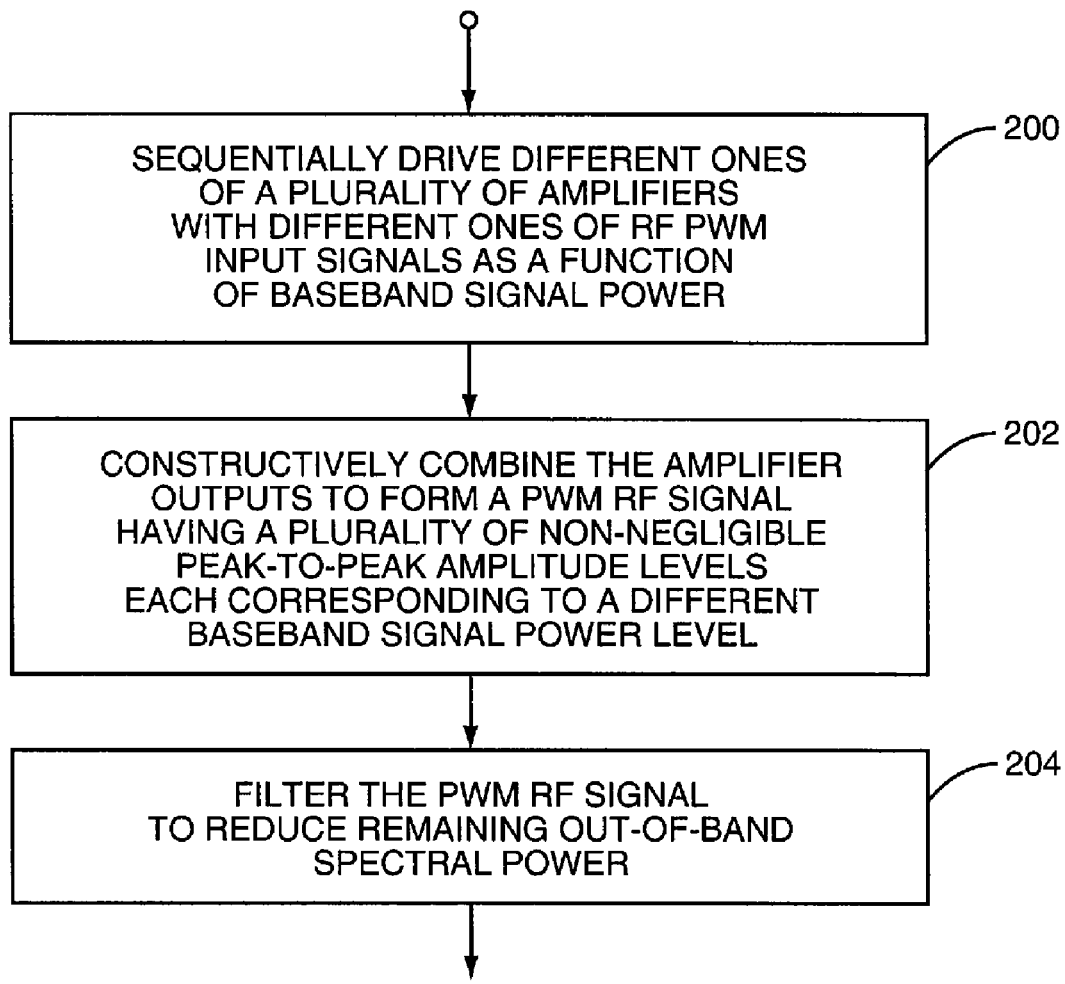
FIG. 2 is a logic flow diagram of an embodiment of processing logic for converting a baseband signal to an RF signal.

The amplifier outputs are constructively combined to form an amplified PWM signal ($V_{PWM\_AMP}$), e.g., as illustrated by Step 202 of FIG. 2. The peak-to-peak amplitude of the amplified PWM signal changes as a function of the number of amplifiers actively being driven. The signal has a first non-negligible peak-to-peak amplitude when only the main amplifier is being driven during low baseband power conditions. The peak-to-peak amplitude of the signal increases in a step-wise manner each time an auxiliary amplifier is turned on to assist the main amplifier. The peak-to-peak amplitude of the amplifier circuitry output similarly decreases in a step-wise manner each time an auxiliary amplifier is turned off. Thus, the power amplifier circuitry output has a non-negligible peak-to-peak amplitude that changes as a function of baseband signal power. The advantageous spectral properties of the multi-level (e.g., 0, 0.5, 1) PWM signal being generated, compared to a two-level (e.g., 0 and 1) PWM signal, results in less out-of-band spectral power at low baseband power levels, and hence an increased overall transmitter efficiency.

In more detail, the PWM input signal ($V_{PWM\_MAIN}$) applied to the main amplifier is generated as a function of baseband signal power. The PWM circuitry 110 varies the burst duration duty cycle (relative to the period of the comparator modulation signals e.g. $V_{MOD\_MAIN}$ in FIG. 5) of the main PWM input signal from 0 to 100% depending on the current baseband signal level. When the duty cycle of the main PWM input signal reaches 100%, i.e. the main amplifier remains on during the whole cycle of the modulation signal, the PWM circuitry 110 activates the first auxiliary PWM input signal ($V_{PWM\_aux1}$). This signal in turn drives the first auxiliary amplifier included in the RF power amplifier circuitry 120, increasing the total output power of the transmitter 100 by means of coherently combing the output signals from the main and auxiliary amplifiers through active load modulation. The PWM circuitry 110 similarly drives other ones of the auxiliary amplifiers included in or associated with the RF power amplifier circuitry 120.

The combined output ($V_{PWM\_AMP}$) of the RF power amplifier circuitry 120 is passed through the optional isolator 130 and the filter 140 for reducing the remaining out-of-band spectral power, e.g., as illustrated by Step 204 of FIG. 2. In one embodiment, the optional isolator 130 includes a circulator with a dump port. The optional isolator 130 provides a proper load condition for the out-of-band PWM frequency components present at the amplifier circuitry output at low baseband signal power levels. With the isolator 130 in place, the amplifier circuitry 120 sees a wideband resistive load that allows each amplifier to operate at its maximum efficiency, even in the presence of PWM signals at the amplifier outputs. The out-of-band spectral power is reflected by the filter 140 to the dump port of the optional isolator 130 where it is dissipated in a matched load. Alternatively, the reflected power may be re-used by the transmitter 100 as is well known in the art. Regardless, the isolator 130 can be excluded from the transmitter 100, increasing the constraints placed on the filter 140 and/or the amplifier circuitry 120. Either way, the filter 140 drives an output load 150. The bandwidth of the filter 140 depends on the particular application for which the transmitter 100 is used and whether the optional isolator 130 is excluded. The resulting RF output signal ($V_{OUT\_RF}$) has at least two tones. The higher the peak-to-average ratio of the baseband signal, the higher is the return in increased efficiency which can be obtained from increasing the number of amplifiers in the RF power amplifier circuitry 120.

Figure 3:
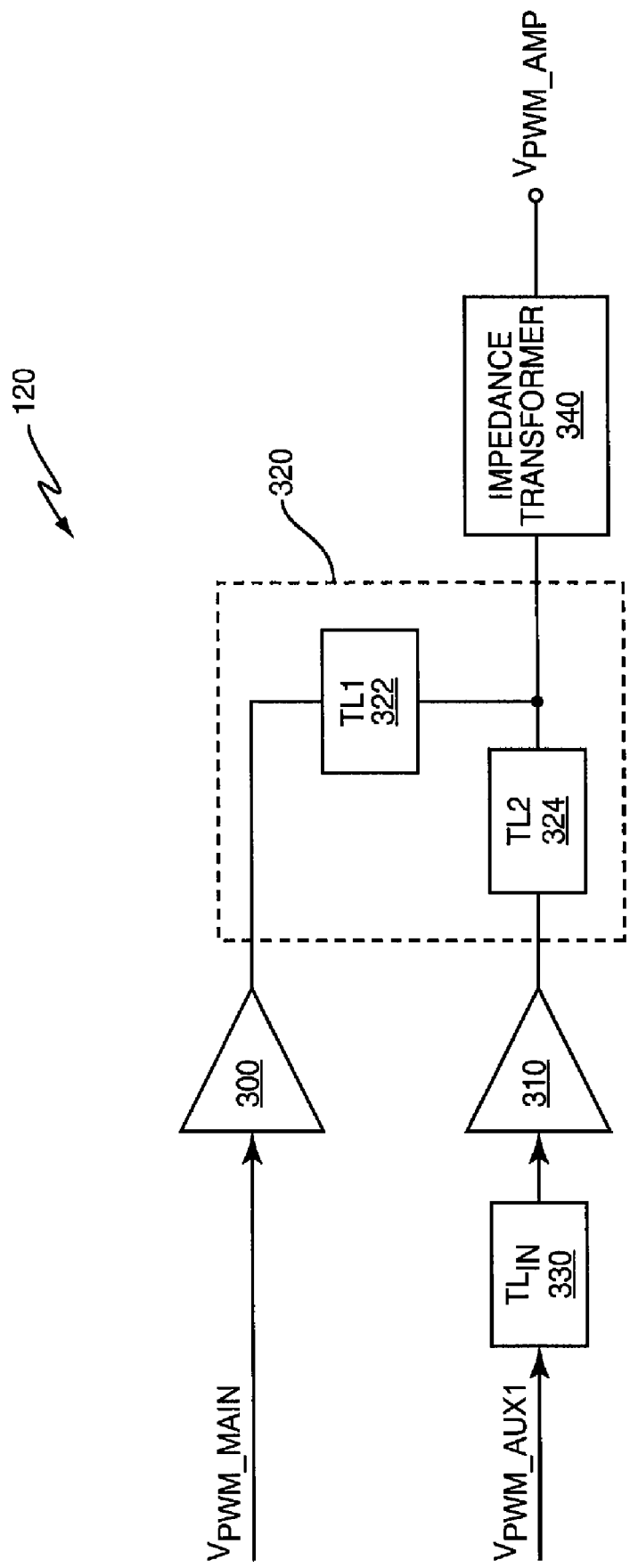
FIG. 3 is a block diagram of an embodiment of RF power amplifier circuitry.

FIG. 3 illustrates one embodiment of the RF power amplifier circuitry 120. According to this embodiment, the amplifier circuitry 120 includes a main RF power amplifier 300 that remains operational while the transmitter 100 is active. The amplifier circuitry 120 also includes one auxiliary RF power amplifier 310 that assists the main amplifier 300 when the output signal level $V_{OUT\_RF}$ and input baseband signal level $V_{BB}$ are above half the maximum level. This way, the amplifier circuitry 120 is more efficient across a wider range of power levels.

The amplifier outputs are coupled together by a transmission line coupler 320 including a first transmission line 322 and a second transmission line 324. The auxiliary amplifier 310 has a transmission line input 330 that compensates for phase shifting that occurs between the amplifier outputs. In another embodiment, the different transmission lines 322, 324, 330 can be replaced by an equivalent impedance-inverting network using inductors and capacitors, or transmission lines and capacitors, in a T or Pi network configuration. Regardless, the main amplifier 300 is driven by the main PWM input signal ($V_{PWM\_MAIN}$) generated by the PWM circuitry 110. The peak-to-peak amplitude of the main PWM input signal is negligible when the baseband signal power is below a first threshold level controlled by a modulation waveform $V_{MOD\_MAIN}$. The peak-to-peak amplitude of the main PWM input signal increases to a non-negligible level when the baseband signal power is between the first threshold level and a second threshold level controlled by a modulation waveform $V_{MOD\_aux1}$. The peak-to-peak amplitude of the signal rises to an even higher non-negligible level when the baseband signal power is at or above the second threshold level. In one embodiment, the first threshold level is controlled by a triangle signal which sweeps between 0 and half the maximum baseband signal magnitude, and the second threshold level is controlled by a triangle signal which sweeps between half and the maximum baseband signal magnitude.

Figure 4:
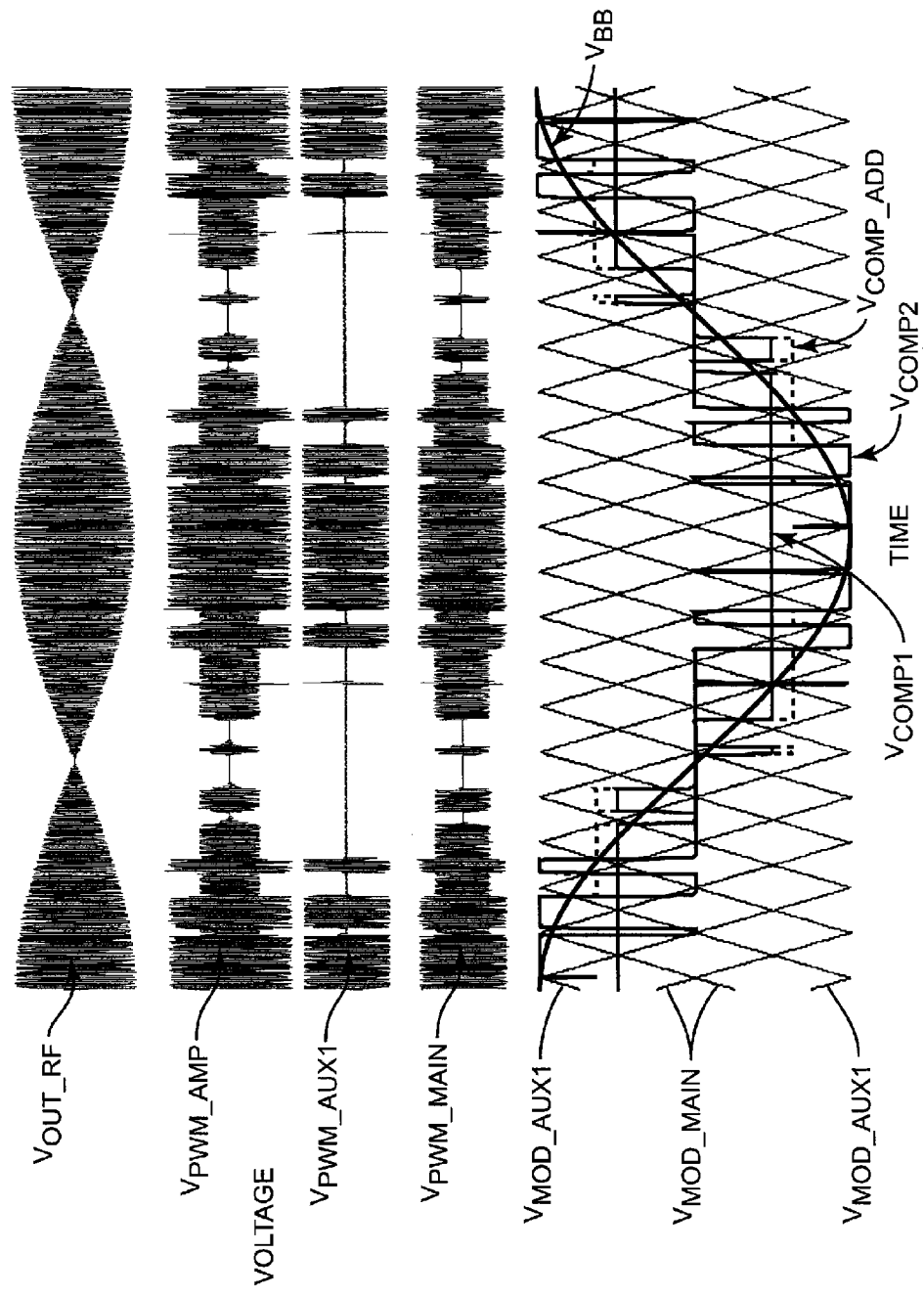
FIG. 4 is a timing diagram associated with the RF transmitter of FIG. 1, the RF power amplifier circuitry of FIG. 3, and the PWM circuitry of FIG. 5.

The auxiliary amplifier 310 is similarly driven by the first auxiliary PWM input signal ($V_{PWM\_AUX1}$) generated by the PWM circuitry 110. The auxiliary amplifier 310 is activated when the main amplifier 300 approaches continuous operation (i.e., 100% duty cycle). In one embodiment, the auxiliary amplifier 310 is activated when the baseband signal power exceeds the second varying threshold level, as defined by the modulation signal $V_{MOD\_AUX1}$. The peak-to-peak amplitude of the auxiliary PWM input signal is negligible when the baseband signal power is below the second threshold level. It rises to a non-negligible level when the baseband signal power is at or above the second threshold level. In one embodiment, the main and peak amplifiers 300, 310 are approximately the same size. Accordingly, the peak-to-peak amplitude of the auxiliary PWM input signal rises approximately to the higher non-negligible peak-to-peak amplitude of the main PWM input signal when the baseband signal power is at or above the second threshold level. FIG. 4 illustrates the amplitude levels of the main and auxiliary PWM input signals, respectively.

The main amplifier 300 amplifies the main PWM input signal ($V_{PWM\_MAIN}$) and the auxiliary amplifier 310 similarly amplifies the auxiliary PWM input signal ($V_{PWM\_AUX1}$). In one embodiment, only the main amplifier 300 is driven or active when the voltage of the baseband signal ($V_{BB}$) is less than ½ of the maximum baseband voltage, i.e., the baseband signal power is less than ¼ of the maximum baseband power. When the auxiliary amplifier 310 is not being driven, the load line impedance seen by the main amplifier 300 doubles because of the provision of the transmission line coupler 320. At a constant signal power of ¼ of the maximum power, the main amplifier 300 is operating continuously (i.e., 100% duty cycle) while the auxiliary amplifier 310 is completely off. Thus there is zero out-of-band power at this power level, and hence the transmitter 100 operates with maximum efficiency, even at this power level, −6 dB below the maximum output power level.

The auxiliary amplifier 310 is driven when the baseband signal voltage rises above ½ of the maximum baseband voltage. Both amplifiers 300, 310 are driven with relatively equal-amplitude PWM input signals when this condition occurs as shown in FIG. 4. Each amplifier 300, 310 delivers approximately ½ of the total maximum transmitter power when they are both on and of the same size. Moreover, the impedance seen by both amplifiers 300, 310 is ½ of that seen by the main amplifier 300 when the auxiliary amplifier 310 is not being driven, e.g., when the baseband signal power is less than ¼ of the maximum baseband power. In one embodiment, the transmission line coupler 320 that connects the amplifier outputs provide a 90° phase shift at the RF carrier frequency. Accordingly, the amplifier output signals are constructively combined with little or no loss because the amplifier output signals are coherent, except when the auxiliary amplifier 310 is turned off and is essentially invisible to the main amplifier 300 at low baseband power levels. An optional impedance transformer 340 transforms the total output impedance of the RF amplifier circuitry 120. The amplifier output signal ($V_{PWM\_AMP}$) is a pulse-width modulation RF signal having a plurality of non-negligible peak-to-peak amplitude levels each corresponding to a different baseband signal power range as shown in FIG. 4. The pulse-width modulation RF signal is passed through the optional isolator 130 and the filter 140 to form the RF output signal ($V_{OUT\_RF}$). The RF output signal has two tones in this embodiment as shown in FIG. 4. In some embodiments, the signal is a complex signal such as used in EDGE, W-CDMA, etc., in which case the input baseband signal $V_{BB}$ is their envelope, and the RF carrier is phase-modulation before multiplication with the baseband PWM signals.

Figure 5:
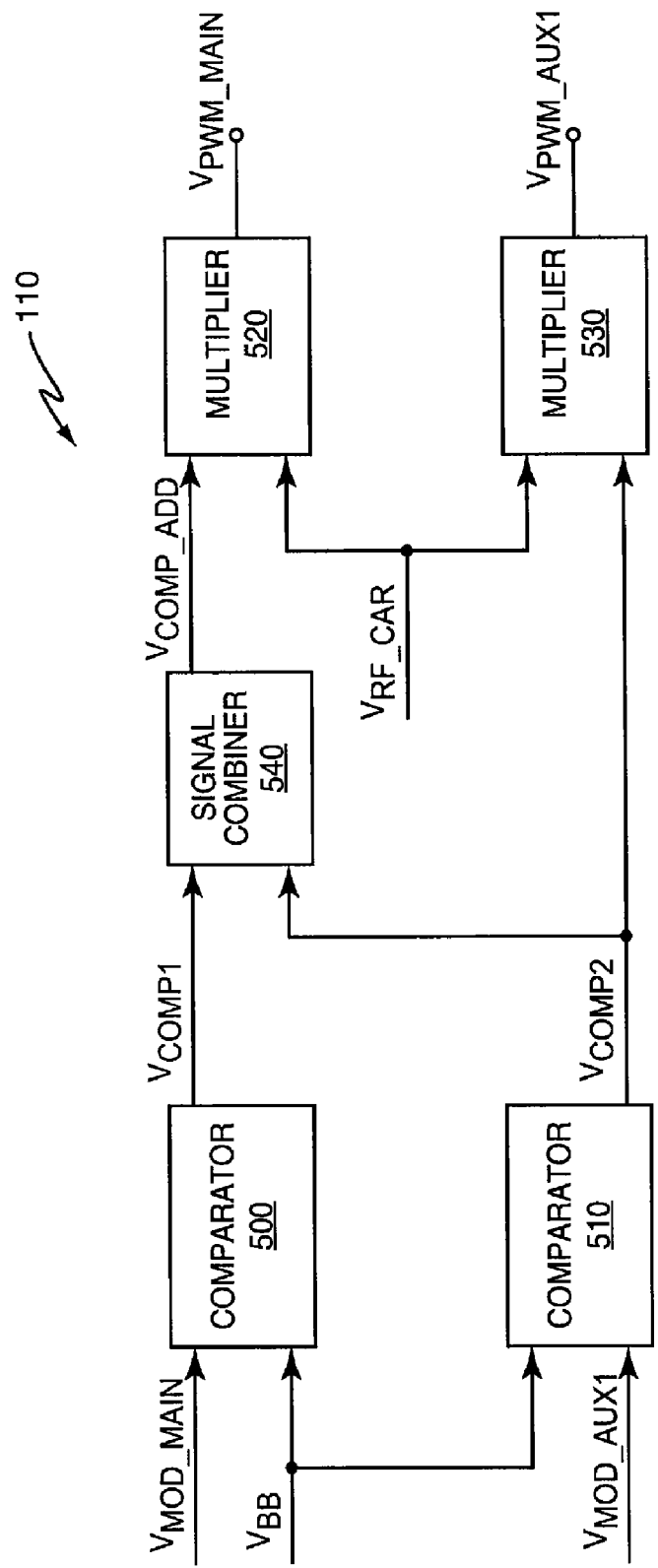
FIG. 5 is a block diagram of an embodiment of PWM circuitry.

FIG. 5 illustrates one embodiment of the PWM circuitry 100 which generates the PWM input signals that drive the main and auxiliary power amplifiers 300, 310 of FIG. 3. According to this embodiment, the PWM circuitry 110 includes first and second comparators 500, 510, first and second multipliers 520, 530 and a signal combiner 540. The PWM circuitry 110 generates the PWM input signal provided to the RF power amplifier circuitry 120 based on the baseband signal power level. In one embodiment, the baseband signal is not complex. In another embodiment, the baseband signal is the envelope of a complex baseband signal which e.g. may include complex In-phase and Quadrature (I/Q) components of a WCDMA (Wideband CDMA) or EDGE (Enhanced Data Rates for GSM Evolution) signal. In such case, the phase of the RF carrier $V_{RF\_CAR}$ contains the phase information of the complex I/Q signal, imparted by a phase modulator (not shown).

Either way, the first comparator 500 compares the baseband signal ($V_{BB}$) to a main modulation signal ($V_{MOD\_MAIN}$) having a relatively low peak-to-peak amplitude, providing a first comparator output signal ($V_{COMP1}$). The first comparator output has a relatively low positive (negative) value when the baseband signal is positive (negative) and its magnitude is higher than that of the main modulation signal. Otherwise, the first comparator output is negligible. The second comparator 510 similarly provides a second comparator output signal ($V_{COMP2}$) having a relatively (compared to the first comparator output signal) high positive (negative) value when the baseband signal is positive (negative) and its magnitude is higher than that of the auxiliary modulation signal ($V_{MOD\_AUX1}$) having a relatively high peak-to-peak amplitude. The baseband signal magnitude must exceed a higher threshold for the second comparator output to have a relatively high non-negligible value because the auxiliary modulation signal has a higher offset level than the main modulation signal. In one embodiment, the main and auxiliary modulation signals are triangle signals as shown in FIG. 4.

Regardless, the signal combiner 540 combines the first and second comparator outputs. The signal combiner output ($V_{COMP\_ADD}$) thus has negligible peak-to-peak amplitude when the baseband signal magnitude is below both the main and auxiliary modulation signal levels. The combiner output has a relatively low non-negligible peak-to-peak amplitude corresponding to the first comparator output when the baseband signal magnitude is above the main modulation signal level, but below the auxiliary modulation signal level. The combiner output amplitude is even higher (corresponding to the second comparator output) when the baseband signal magnitude is above the auxiliary modulation signal level. The signal combiner 540 can be implemented by a logical element circuit providing the output as a function of the inputs. The signal combiner 540 may in one embodiment be implemented as a selector or selector-like circuit wherein the first input (Vcomp1) is selected to be provided to the output when the second input is negligible (zero) and the second input is selected to be provided to the output when the second input is non-negligible (non-zero).

The signal combiner output is input to the first multiplier 520 while the second comparator output ($V_{COMP2}$) is correspondingly input to the second multiplier 530. An RF carrier signal ($V_{RF\_CAR}$) is also input to each multiplier 520, 530. Each multiplier 520, 530 switches the RF carrier signal on and off based on the respective multiplier inputs, each multiplier output yielding a signal containing bursts of RF cycles. Particularly, the first multiplier 520 outputs the main PWM input signal ($V_{PWM\_MAIN}$) provided to the main RF power amplifier 300 and the second multiplier 530 outputs the auxiliary PWM input signal ($V_{PWM\_AUX1}$) provided to the auxiliary RF amplifier 310. The first multiplier output has two non-negligible amplitudes as shown in FIG. 4 because its input signal ($V_{COMP\_ADD}$) has two corresponding non-negligible amplitudes as described above. The second multiplier output has a single non-negligible amplitude as shown in FIG. 4 because its input signal ($V_{COMP2}$) has one corresponding non-negligible amplitude also as described above. This way, the main RF power amplifier 300 can be driven at or near saturation both when the baseband signal power is relatively low and relatively high, and the auxiliary amplifier 310 can driven at or near saturation when the baseband signal power is relatively high. This ensures that both amplifiers 300, 310 always operate in saturation, and thus can be either of class AB or switched-mode type. Since the gain of the main amplifier 300 depends on the load impedance, which is higher when the auxiliary amplifier 310 is off, its drive signal $V_{PWM\_MAIN}$ is decreased compared to when the auxiliary amplifier 310 is on, to ensure linear transmitter operation. According to one embodiment, when both transistors are of the same size, the main amplifier input signal is adjusted to have the output power exactly ¼ of the maximum output power, when the auxiliary amplifier 310 is off.

Figure 6:
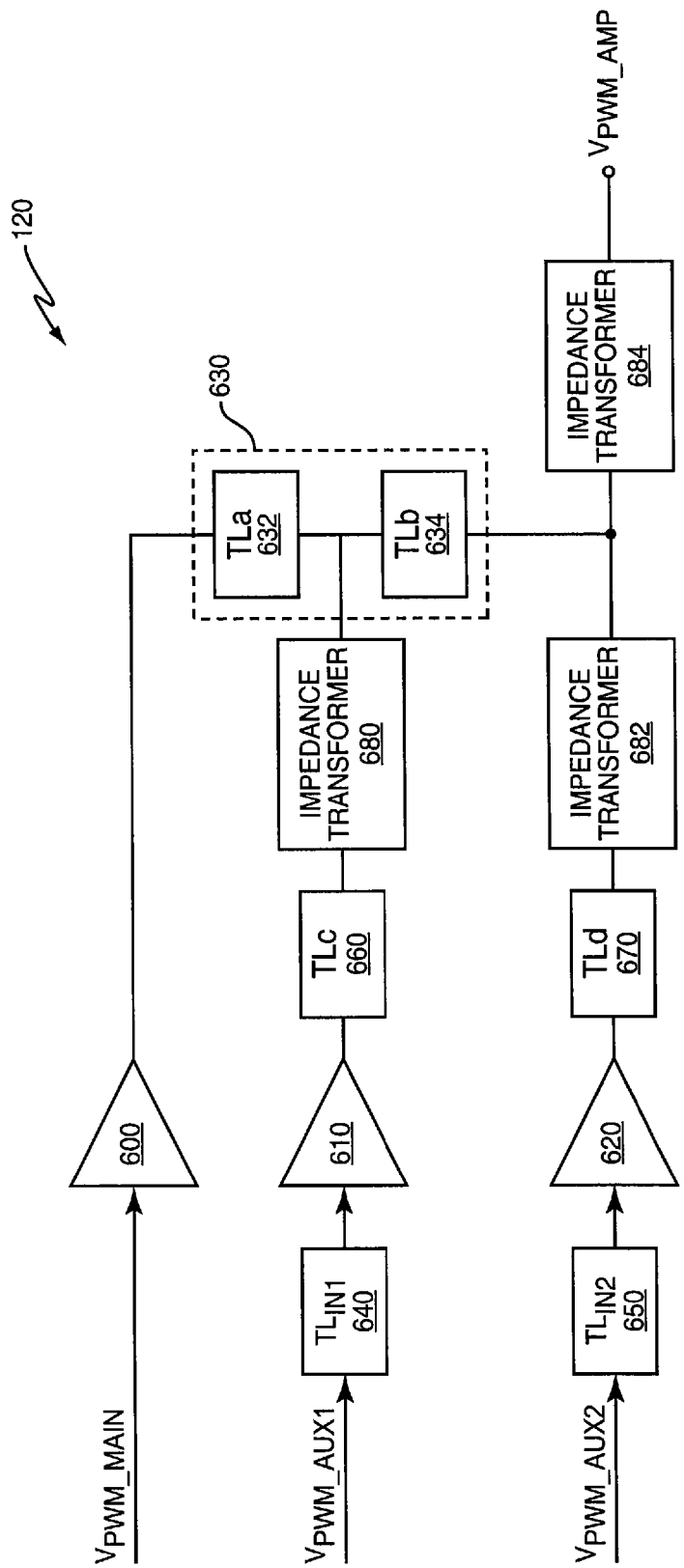
FIG. 6 is a block diagram of another embodiment of RF power amplifier circuitry.

FIG. 6 illustrates another embodiment of the RF amplifier circuitry 120. According to this embodiment, the amplifier circuitry 120 includes a main RF power amplifier 600, a first auxiliary RF power amplifier 610 and a second auxiliary RF power amplifier 620. Only the main amplifier 600 has a non-negligible output when the baseband signal power is between first and second threshold levels. The main amplifier 600 and the first auxiliary amplifier 610 are driven when the baseband signal power is between the second threshold level and a third threshold. The second auxiliary amplifier 620 is not driven until the baseband signal power rises above the third threshold level.

In one embodiment, the first threshold corresponds to a baseband signal voltage of less than approximately 25% of the maximum voltage, i.e., when baseband power is less than approximately ¹⁄₁₆ of the total maximum power. The second threshold corresponds to a baseband signal voltage between approximately 25% and 50%, i.e., when baseband power is between approximately ¹⁄₁₆ and ¼ of the total maximum power. This way, the main amplifier 600 approaches continuous operation as the baseband signal power nears ¹⁄₁₆ of the total maximum power, reducing out-of-band spectral energy at even lower baseband power levels. The first auxiliary amplifier 610 begins to assist the main amplifier 600 when the baseband signal power exceeds ¹⁄₁₆ of the total power. The first auxiliary amplifier 610 approaches continuous operation as the baseband signal power approaches ¼ of the total power. The PWM circuitry 110 then activates the second auxiliary amplifier 620. The second auxiliary amplifier 620 approaches continuous operation as the baseband signal power nears the total maximum power.

The amplifier outputs are coupled together by a transmission line coupler 630 including first and second transmission lines 632, 634. The respective impedances of the transmission lines 632, 634 are selected so that the amplifier outputs can be constructively combined, and to ensure all amplifiers see load impedances enabling the amplifiers to operate in or near saturation (with maximum efficiency) at all three (e.g., ¹⁄₁₆, ¼, and 1× maximum) output power levels. The first and second auxiliary amplifiers 610, 620 each have a transmission line input 640, 650, respectively, that compensates for phase shifting that occurs between the amplifier outputs. First and second compensation transmission lines 660, 670 can be added to the outputs of the first and second auxiliary amplifiers 610, 620, respectively. The compensation transmission lines 660, 670 are selected to minimize the loading of the main amplifier 600 from the auxiliary amplifiers 610, 620 when they are not being driven. In another embodiment, the different transmission lines 632, 634, 640, 650, 660, 670 can be replaced by an equivalent impedance-inverting network using inductors and capacitors, or transmission lines and capacitors, in a T or Pi network configuration. Moreover, optional impedance transformers 680, 682, 684 can be included. A first impedance transformer 680 transforms the output impedance of the first auxiliary amplifier 610 while a second impedance transformer 682 transforms the output impedance of the second auxiliary amplifier 620. A third impedance transformer 684 transforms the total output impedance of the RF amplifier circuitry 120.

Figure 7:
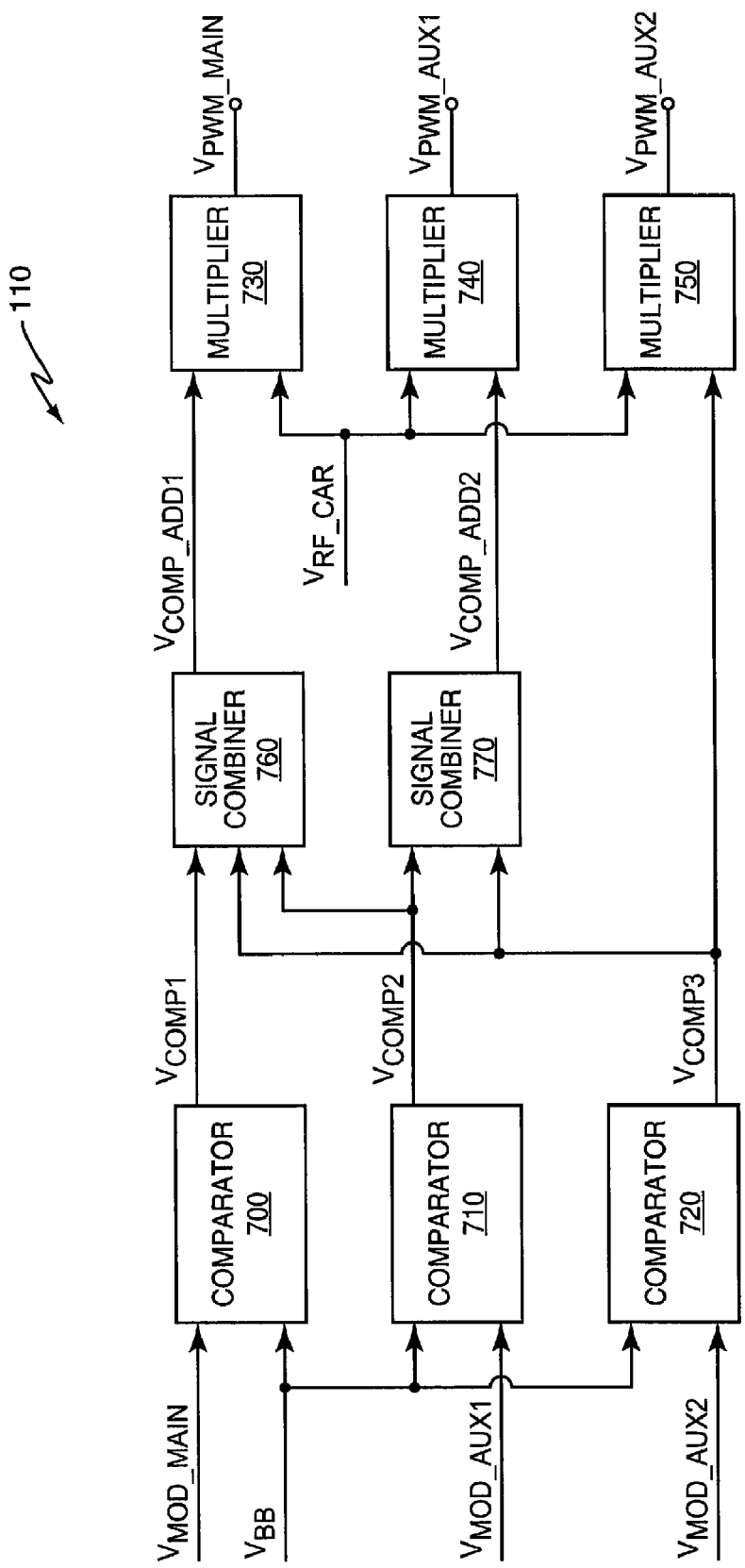
FIG. 7 is a block diagram of another embodiment of PWM circuitry.
Figure 8:
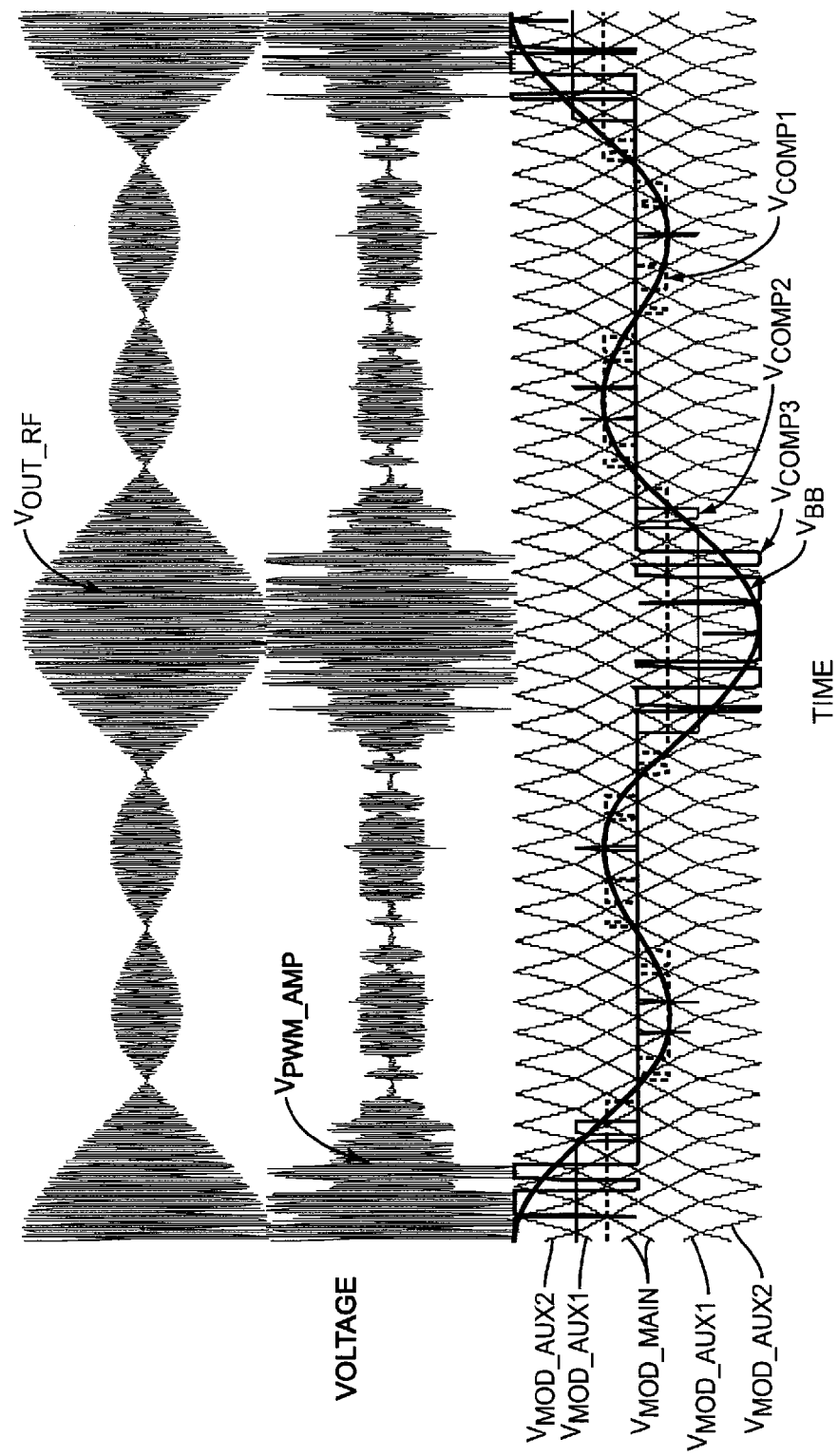
FIG. 8 is a timing diagram associated with the RF transmitter of FIG. 1, the RF power amplifier circuitry of FIG. 6, and the PWM circuitry of FIG. 7.

FIG. 7 illustrates another embodiment of the PWM circuitry 110. According to this embodiment, the PWM circuitry 110 generates the three PWM input signals ($V_{PWM\_MAIN}$, $V_{PWM\_AUX1}$ and $V_{PWM\_AUX2}$) provided to the RF power amplifier circuitry 120 of FIG. 6. The PWM circuitry 110 includes three comparators 700, 710, 720, three multipliers 730, 740, 750 and two signal combiners 760, 770. The first comparator 700 compares the baseband signal ($V_{BB}$) to the main modulation signal ($V_{MOD\_MAIN}$) which has a relatively low peak-to-peak voltage range, providing a first comparator output signal ($V_{COMP1}$). The second comparator 710 similarly provides a second comparator output signal ($V_{COMP2}$) corresponding to the difference between the baseband signal and the first auxiliary modulation signal ($V_{MOD\_AUX1}$) having a relatively intermediate peak-to-peak voltage range. The baseband signal magnitude must exceed a higher threshold for the second comparator output to be non-negligible because the auxiliary modulation signal has a higher offset voltage than the main modulation signal. The third comparator 720 provides a third comparator output signal ($V_{COMP3}$) corresponding to the difference between the baseband signal and a second auxiliary modulation signal ($V_{MOD\_AUX2}$) having a relatively high peak-to-peak amplitude and voltage range. The baseband signal magnitude must exceed an even greater threshold for the third comparator output to be non-negligible. In one embodiment, the main and auxiliary modulation signals are triangle signals as shown in FIG. 8.

According to an embodiment, the first signal combiner 760 combines the first, second and third comparator outputs. The second signal combiner 770 similarly combines the second and third comparator outputs. The first combiner output ($V_{COMP\_ADD1}$) has a negligible peak-to-peak amplitude when the baseband signal magnitude is below the main modulation signal level. The first combiner output has a non-negligible peak-to-peak amplitude corresponding to the first comparator output when the baseband signal magnitude is above the main modulation signal level, but below the first auxiliary modulation signal level. The signal amplitude is even higher (corresponding to the second comparator output) when the baseband signal magnitude is between the first and second auxiliary modulation signal levels. The amplitude of the first combiner output is independent of the third comparator output.

The second signal combiner output ($V_{COMP\_ADD2}$) similarly has negligible peak-to-peak amplitude when the baseband signal magnitude is below the first auxiliary modulation signal level. The second combiner output has a non-negligible peak-to-peak amplitude corresponding to the second comparator output when the baseband signal magnitude is between the first and second modulation signal levels. The signal amplitude is even higher (corresponding to the third comparator output) when the baseband signal magnitude is above the second auxiliary modulation signal level.

The first signal combiner output ($V_{COMP\_ADD1}$) is input to the first multiplier 730. The second signal combiner output ($V_{COMP\_ADD2}$) is input to the second multiplier 740. The third comparator output ($V_{COMP2}$) is input to the third multiplier 750. An RF carrier signal ($V_{RF\_CAR}$) is also input to each multiplier 730, 740, 750, causing the RF carrier signal to be switched on and off based on the respective multiplier inputs. This way, all RF power amplifiers 600, 610 and 620, can be driven at or near saturation when activated. The dependence of the signal combiner outputs ($V_{COMP\_ADD1}$, $V_{COMP\_ADD2}$) on the comparator outputs ($V_{COMPn}$) are adjusted to ensure the amplifiers 600, 610 and 620 are operating near saturation at all three output power levels, and combining their output signals to the required power levels of $\frac{1}{16}$, $\frac{1}{4}$, and 1 times, the maximum power to ensure linear operation of the transmitter 100, as well as to compensate for gain changes in each amplifier depending on the number of active amplifiers. Thus, the amplifier circuitry output ($V_{PWM\_AMP}$) has three different non-negligible peak-to-peak amplitudes as shown in FIG. 8. Moreover, the filter 140 outputs an RF signal, in the example in FIG. 8 having 4 discrete tones. In embodiments, n amplifiers may be used to create a combined amplifier output signal having 2n non-negligible (non-zero) voltage levels and one negligible (zero) voltage level where $n \geq 2$. The 2n+1 voltage levels correspond to n non-negligible power levels and one negligible power level in the combined amplifier output signal since positive and negative voltage levels having the same amplitude have a same power level. Or in other words, the resulting PWM RF signal ($V_{PWM\_AMP}$) would have n different non-negligible peak-to-peak amplitudes and one negligible (zero) peak-to-peak amplitude.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a baseband signal, comprising:
   amplifying a first pulse width modulation radio frequency signal having a negligible peak-to-peak amplitude when a baseband signal power is below a first threshold level, a first non-negligible peak-to-peak amplitude when the baseband signal power is between the first threshold level and a second threshold level and a second, larger non-negligible peak-to-peak amplitude when the baseband signal power is at or above the second threshold level;
   amplifying a second pulse width modulation radio frequency signal having a negligible peak-to-peak amplitude when the baseband signal power is below the second threshold level and a non-negligible peak-to-peak amplitude approximately equal to the second non-negligible peak-to-peak amplitude of the first pulse width modulation radio frequency signal when the baseband signal power is at or above the second threshold level; and
   constructively combining the amplified signals to form a third pulse width modulation radio frequency signal having a plurality of non-negligible peak-to-peak amplitude levels each corresponding to a different baseband signal power level.

2. The method of claim 1, wherein the first and second pulse width modulation radio frequency signals are generated by:
   comparing the baseband signal to a first modulation signal having a first peak-to-peak voltage range to obtain a first pulse width modulation signal;
   comparing the baseband signal to a second modulation signal having a second peak-to-peak voltage range to obtain a comparison signal and combining the comparison signal with the first pulse width modulation signal to obtain a second pulse width modulation signal;
   multiplying the first pulse width modulation signal with a first carrier signal to obtain the first pulse width modulation radio frequency signal; and
   multiplying the second pulse width modulation signal with a second carrier signal to obtain the second pulse width modulation radio frequency signal.

3. The method of claim 1, wherein constructively combining the amplified signals comprises coupling a transmission line between the amplified signals, the transmission line having an approximately ninety-degree phase shift at a carrier signal frequency.

4. The method of claim 1, further comprising filtering the third pulse width modulation radio frequency signal to obtain a radio frequency signal having at least two tones.

5. The method of claim 1, further comprising dissipating out-of-band frequency components of the third pulse width modulation radio frequency signal.

6. A device, comprising:
   a first amplifier operable to amplify a first pulse width modulation radio frequency signal having a negligible peak-to-peak amplitude when a power of a baseband signal is below a first threshold level, a first non-negligible peak-to-peak amplitude when the baseband signal power is between the first threshold level and a second threshold level and a second, larger non-negligible peak-to-peak amplitude when the baseband signal power is at or above the second threshold level;
   a second amplifier operable to amplify a second pulse width modulation radio frequency signal having a negligible peak-to-peak amplitude when the baseband signal power is below the second threshold level and a non-negligible peak-to-peak amplitude approximately equal to the second non-negligible peak-to-peak amplitude of the first pulse width modulation radio frequency signal when the baseband signal power is at or above the second threshold level; and
   wherein the amplifier outputs are constructively combined to form a third pulse width modulation radio frequency signal having a plurality of non-negligible peak-to-peak amplitude levels corresponding to different baseband signal power ranges.

7. The device of claim 6, further comprising:
   a first comparator operable to compare the baseband signal to a first modulation signal having a first peak-to-peak voltage range to obtain a first pulse width modulation signal;
   a second comparator operable to compare the baseband signal to a second modulation signal having a second peak-to-peak voltage range to obtain a comparison signal;
   a combiner operable to combine the comparison signal with the first pulse width modulation signal to obtain a second pulse width modulation signal;
   a first multiplier operable to multiply the first pulse width modulation signal with a first carrier signal to obtain the first pulse width modulation radio frequency signal; and
   a second multiplier operable to multiply the second pulse width modulation signal with a second carrier signal to obtain the second pulse width modulation radio frequency signal.

8. The device of claim 6, wherein the radio frequency transmitter comprises a transmission line coupled between the amplifier outputs, the transmission line having an approximately ninety-degree phase shift at a carrier signal frequency.

9. The device of claim 6, further comprising a filter operable to filter the third pulse width modulation radio frequency signal to obtain a radio frequency signal having at least two tones.

10. The device of claim 6, further comprising a signal isolator operable to dissipate out-of-band frequency components of the third pulse width modulation radio frequency signal.

11. A method of processing a baseband signal, comprising:
driving first and second power amplifiers with pulse width modulation input signals of approximately equal non-negligible amplitude when a baseband signal power is above a first threshold level;
driving only the first power amplifier with a pulse width modulation input signal having a reduced non-negligible amplitude when the baseband signal power is below the first threshold level;
constructively combining the amplifier outputs to form a pulse width modulation radio frequency signal having a plurality of different non-negligible peak-to-peak amplitudes corresponding to different power ranges of the baseband signal; and
filtering the pulse width modulation radio frequency signal to obtain a radio frequency signal having at least two tones.

12. The method of claim 11, further comprising:
driving the first, second and a third power amplifier with pulse width modulation input signals of approximately equal increased non-negligible amplitude when the baseband signal power is at or above a second threshold level higher than the first threshold level; and
driving only the first and second power amplifiers when the baseband signal power is between the first and second threshold levels.

13. The method of claim 11, wherein constructively combining the amplifier outputs comprises coupling a transmission line between the amplifier outputs, the transmission line having an approximately ninety-degree phase shift at a carrier frequency used to generate the pulse width modulation input signals.

14. The method of claim 11, further comprising dissipating out-of-band frequency components of the pulse width modulation radio frequency signal.

15. A radio frequency transmitter, comprising:
first and second power amplifiers operable to be driven with pulse width modulation input signals of approximately equal non-negligible amplitude when a power of a baseband signal is above a first threshold level, wherein only the first power amplifier is operable to be driven with a reduced non-negligible amplitude pulse width modulation input signal when the baseband signal power is below the first threshold level;
signal amplification circuitry operable to constructively combine the amplifier outputs to generate a pulse width modulation radio frequency signal having a plurality of different non-negligible peak-to-peak amplitudes corresponding to different power ranges of the baseband signal; and
a filter operable to filter the pulse width modulation radio frequency signal to obtain a radio frequency signal having at least two tones.

16. The radio frequency transmitter of claim 15, wherein the signal amplification circuitry further comprises a third power amplifier, wherein the first, second and third power amplifiers are operable to be driven with pulse width modulation input signals of approximately equal increased non-negligible amplitude when the baseband signal power is at or above a second threshold level higher than the first threshold level, and wherein only the first and second power amplifiers are operable to be driven when the baseband signal power is between the first and second threshold levels.

17. The radio frequency transmitter of claim 15, wherein the radio frequency transmitter comprises at least one transmission line coupled between the amplifier outputs, the transmission line having an approximately ninety-degree phase shift at a carrier frequency used to generate the pulse width modulation input signals.

18. The radio frequency transmitter of claim 15, further comprising a signal isolator operable to dissipate out-of-band frequency components of the pulse width modulation radio frequency signal.

* * * * *